(12) United States Patent
Goh et al.

(10) Patent No.: US 10,741,817 B2
(45) Date of Patent: Aug. 11, 2020

(54) BATTERY CONNECTION MODULE

(71) Applicants: Molex, LLC, Lisle, IL (US); Keihin Corporation, Shinjuku-ku (JP)

(72) Inventors: Siow-Pheng Goh, Singapore (SG); Kian Heng Lim, Singapore (SG); Shingo Tsuchiya, Shioya-gun (JP); Seiji Kamata, Shioya-gun (JP)

(73) Assignees: Molex, LLC, Lisle, IL (US); Keihin Corporation, Shinjuku-ku, Tokyo ( * ) Notice: Subject to any disclaimer, the term of this patent is extended or adjusted under 35 U.S.C. 154(b) by 33 days.

(21) Appl. No.: 16/133,909

(22) Filed: Sep. 18, 2018

(65) Prior Publication Data

US 2019/0088918 A1 Mar. 21, 2019

(30) Foreign Application Priority Data

Sep. 20, 2017 (CN) .......................... 2017 1 0861594
Sep. 11, 2018 (CN) .......................... 2018 1 1056740

(51) Int. Cl.
*H01M 2/00* (2006.01)
*H01M 2/20* (2006.01)
(Continued)

(52) U.S. Cl.
CPC ......... *H01M 2/206* (2013.01); *H01M 10/425* (2013.01); *H01R 12/65* (2013.01);
(Continued)

(58) Field of Classification Search
CPC .. H05K 2201/055; H05K 2201/10037; H01M 10/425; H01M 2/206; H01M 2220/20
See application file for complete search history.

(56) References Cited

U.S. PATENT DOCUMENTS 9,472,797 B2 10/2016 Han et al.
2015/0295283 A1 10/2015 Eom et al.
(Continued)

FOREIGN PATENT DOCUMENTS

CN 102804452 B 8/2015
CN 102859751 B 9/2015
(Continued)

OTHER PUBLICATIONS

Notification of Reasons for Refusal received for Japanese patent application No. 2018-175794, dated Oct. 1, 2019, 4 pages. (2 pages of English translation and 2 pages of Official copy).
(Continued)

*Primary Examiner* — Cynthia H Kelly
*Assistant Examiner* — Monique M Wills
(74) *Attorney, Agent, or Firm* — Molex, LLC (57) ABSTRACT

A battery connection module is adapted to connect a battery pack, the battery connection module comprises: a carrying tray; a plurality of busbars mounted on the carrying tray and adapted to electrically connect a plurality of batteries of the battery pack; a flexible circuit board mounted on the carrying tray and mechanically and electrically connected to the plurality of busbars, the flexible circuit board having a frame-shaped portion with an opening, a flexible mating portion being provided in the opening of the frame-shaped portion; and a battery management system mounted on the carrying tray, positioned above the flexible circuit board and comprising a flexible circuit board connector; the flexible mating portion extending into the opening and being reversely bent and mated with the flexible circuit board connector on the battery management system. These components are integrated to an integrated module that facilitates subsequent assembling and use.

6 Claims, 8 Drawing Sheets

(51) Int. Cl.
  *H01R 12/79* (2011.01)
  *H01R 12/65* (2011.01)
  *H05K 1/02* (2006.01)
  *H05K 1/11* (2006.01)
  *H01M 10/42* (2006.01)
  *H01M 2/10* (2006.01)

(52) U.S. Cl.
  CPC ............ *H01R 12/79* (2013.01); *H05K 1/028* (2013.01); *H05K 1/118* (2013.01); *H01M 2/1077* (2013.01); *H01M 2220/20* (2013.01); *H05K 2201/055* (2013.01); *H05K 2201/10037* (2013.01)

(56) References Cited

U.S. PATENT DOCUMENTS

| | | | |
|---|---|---|---|
| 2016/0043446 A1 | 2/2016 | Fritz et al. | |
| 2016/0128236 A1* | 5/2016 | Pietrantonio | H05K 7/209 361/702 |
| 2016/0133908 A1 | 5/2016 | Zhao | |
| 2018/0090735 A1* | 3/2018 | Huff | H01M 10/482 |
| 2019/0088912 A1 | 3/2019 | Goh et al. | |

FOREIGN PATENT DOCUMENTS

| | | |
|---|---|---|
| CN | 102751465 B | 1/2016 |
| CN | 106104847 A | 11/2016 |
| JP | H09-331119 A | 12/1997 |
| JP | H11-149535 A | 6/1999 |
| JP | H11-250465 A | 9/1999 |
| JP | 2003-045409 A | 2/2003 |
| JP | 2011-210710 A | 10/2011 |
| JP | 2012-190678 A | 10/2012 |
| JP | 2013-225457 A | 10/2013 |
| JP | 2016-115544 A | 6/2016 |
| JP | 2017-004803 A | 1/2017 |
| WO | 2013/054727 A1 | 4/2013 |
| WO | 2015/107583 A1 | 7/2015 |

OTHER PUBLICATIONS

Notification of Reasons for Refusal received for Japanese patent application No. 2018-174383, dated Aug. 13, 2019, 6 pages. (3 pages of English translation and 3 pages of Official copy).

Non-Final rejection received for U.S. Appl. No. 16/133,870, dated Mar. 27, 2020, 13 pages.

* cited by examiner

BATTERY CONNECTION MODULE

RELATED APPLICATIONS

This application claims priority to Chinese Patent Application No. 201710861594.9, filed Sep. 20, 2017, and Chinese Patent Application No. 201811056740.1, filed Sep. 11, 2018, both of which are incorporated herein by reference in their entirety.

TECHNICAL FIELD

The present disclosure relates to a battery connection module, especially to a battery connection module which is used to connect rechargeable batteries in series for high power output.

BACKGROUND ART

A battery system, in which a plurality of electrochemical rechargeable batteries such as batteries for a vehicle, are arranged side by side to form a battery pack generally, generally connects the batteries in series by a battery connection module to form a pair of output electrodes, and the battery connection module is also provided with a control circuit to connect a battery management system (abbreviated BMS).

Chinese patent issuance publication No. CN102751465B (corresponding to Japanese patent JP2012226969A) discloses a battery module, which is connected to a mating-side electrical connector of an external electrical processing device via an electrical connector at a distal end of a flexible flat cable (FFC). The flexible flat Cable (FFC) has to extend a long distance to connect to the external electrical processing device (equivalent to the battery management system) and need to achieve the connection by the two connectors which are mated with each other.

Chinese patent application publication CN105144463A (corresponding to United States patent application publication No. US2016-0043446, Japanese patent application publication No. JP2012226969A, international patent application publication No. WO2014/173684A2) discloses a battery contact system for an electrochemical device, in which a monitoring unit (equivalent to the battery management system) has a pluggable contact connector, a signal transmission system includes one or more signal lines, the signal line electrically connects each signal source to a signal-line connector. The pluggable contact connector of the monitoring unit is mated with the signal line connector of the signal transmission system. Although the monitoring unit is received in a carrying assembly, the signal transmission system is connected to the signal line connection connector by a plurality of signal lines, and needs to connect with the monitoring unit by the two connectors which are mated with each other.

SUMMARY

Therefore, one of the objects of the present disclosure is to provide a battery connection module which has a battery management system and reduces the number of connector.

Accordingly, in some embodiments, a battery connection module of the present disclosure is adapted to connect a battery pack, the battery connection module comprises a carrying tray, a plurality of busbars, a battery management system and a flexible circuit board. The plurality of busbars are mounted on the carrying tray and adapted to electrically connect a plurality of batteries of the battery pack. The flexible circuit board is mounted on the carrying tray and mechanically and electrically connected to the plurality of busbars, the flexible circuit board has a frame-shaped portion with an opening, a flexible mating portion is provided in the opening of the frame-shaped portion. The battery management system is mounted on the carrying tray, positioned above the flexible circuit board and comprises a flexible circuit board connector; the flexible mating portion extends into the opening and is reversely bent and mated with the flexible circuit board connector on the battery management system.

In some embodiments, the flexible mating portion has exposed conductive wires to be mated with the flexible circuit board connector.

In some embodiments, the flexible circuit board further comprises a plurality of conductive plates which are connected to the frame-shaped portion and respectively mechanically and electrically connected to the plurality of busbars.

The present disclosure has following effects: the battery management system is directly mounted on and coupled to the carrying tray and is electrically connected with the busbars via the flexible circuit board, so that they are integrated to an integrated module that facilitates subsequent assembling and use. Moreover, the battery management system only needs to be provided with one flexible circuit board connector to directly connect with the flexible circuit board, which can reduce the number of components and save cost.

Furthermore, the flexible mating portion connected to the battery management system is formed by cutting the body portion constituting the flexible circuit board, which can effectively utilize the space, and is easy to cooperate to the position where the battery management system is coupled to the carrying tray, so that the position where the battery management system is provided has flexibility of change.

BRIEF DESCRIPTION OF THE DRAWINGS

The other features and effects of the present disclosure will be apparent through embodiments with reference to the Figures, in which.

DETAILED DESCRIPTION OF THE PREFERRED EMBODIMENTS

Figure 1:
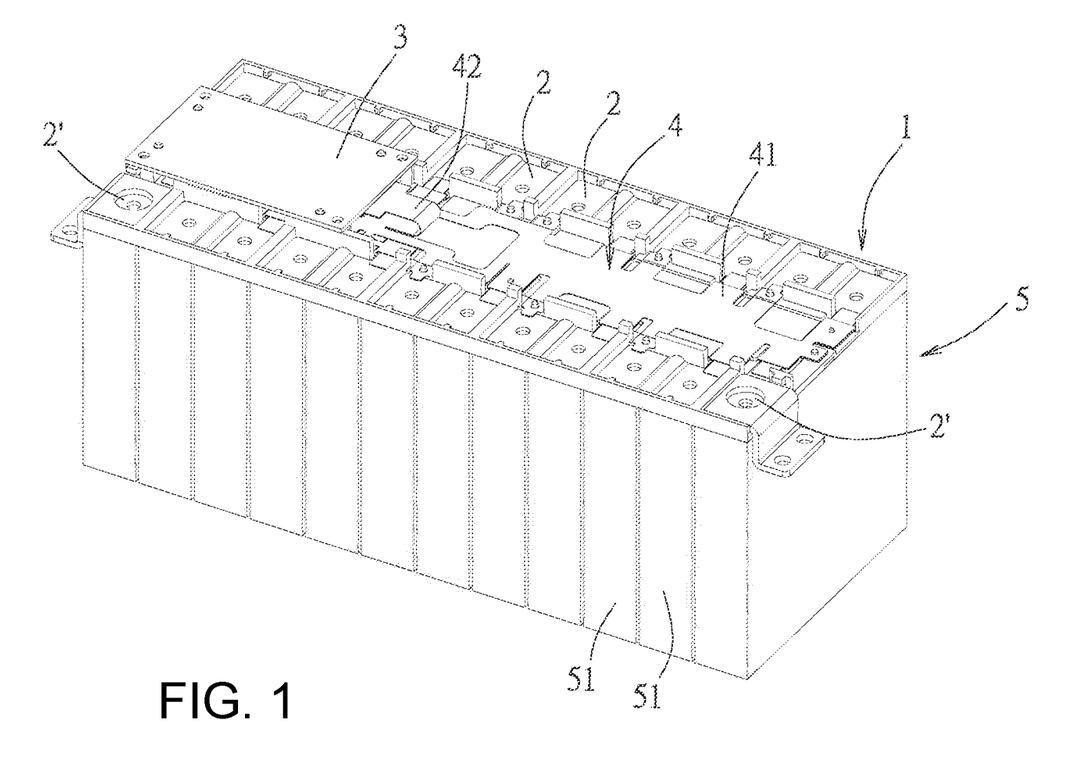
FIG. 1 is a perspective view of an embodiment of a battery connection module of the present disclosure and a battery pack.
Figure 2:
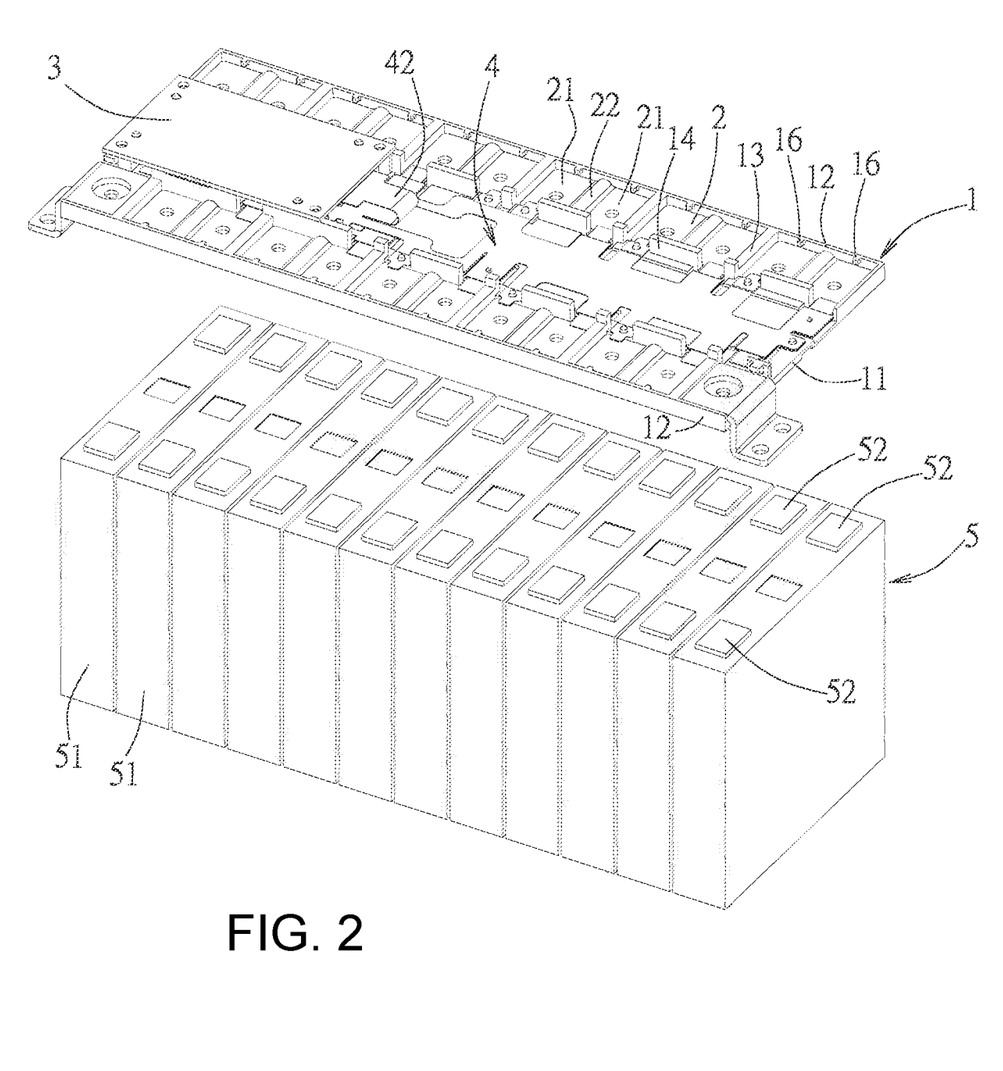
FIG. 2 is an exploded perspective view of the embodiment and the battery pack.
Figure 3:
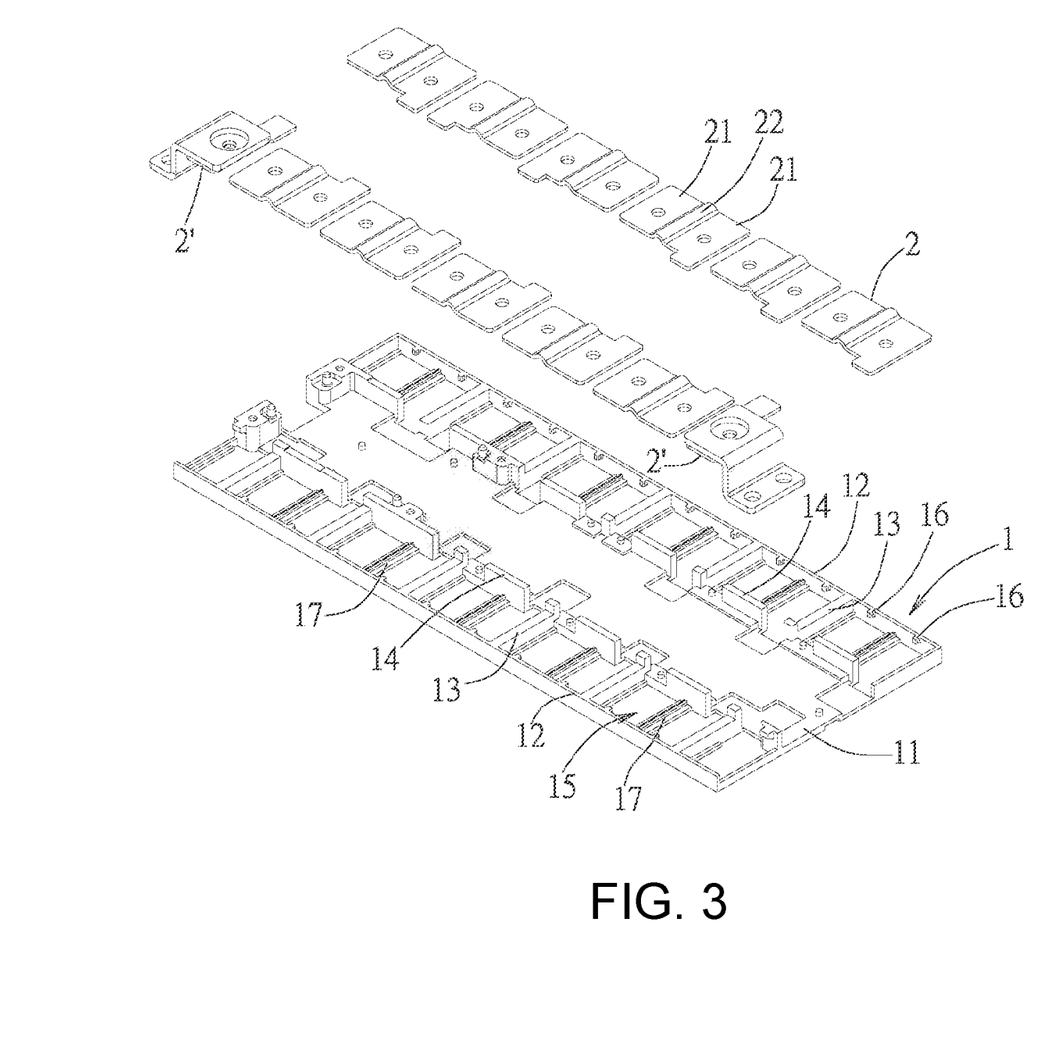
FIG. 3 is an exploded perspective view of a carrying tray and busbars of the embodiment.
Figure 4:
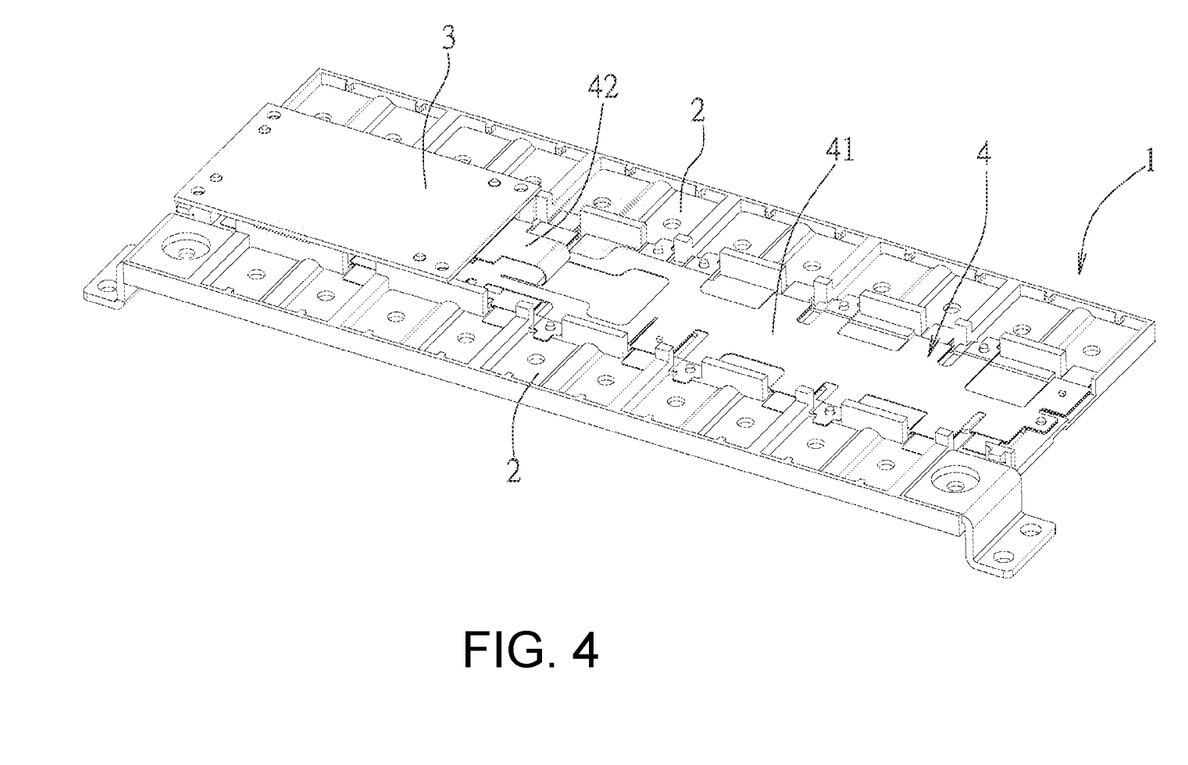
FIG. 4 is a perspective view of the embodiment.
Figure 5:
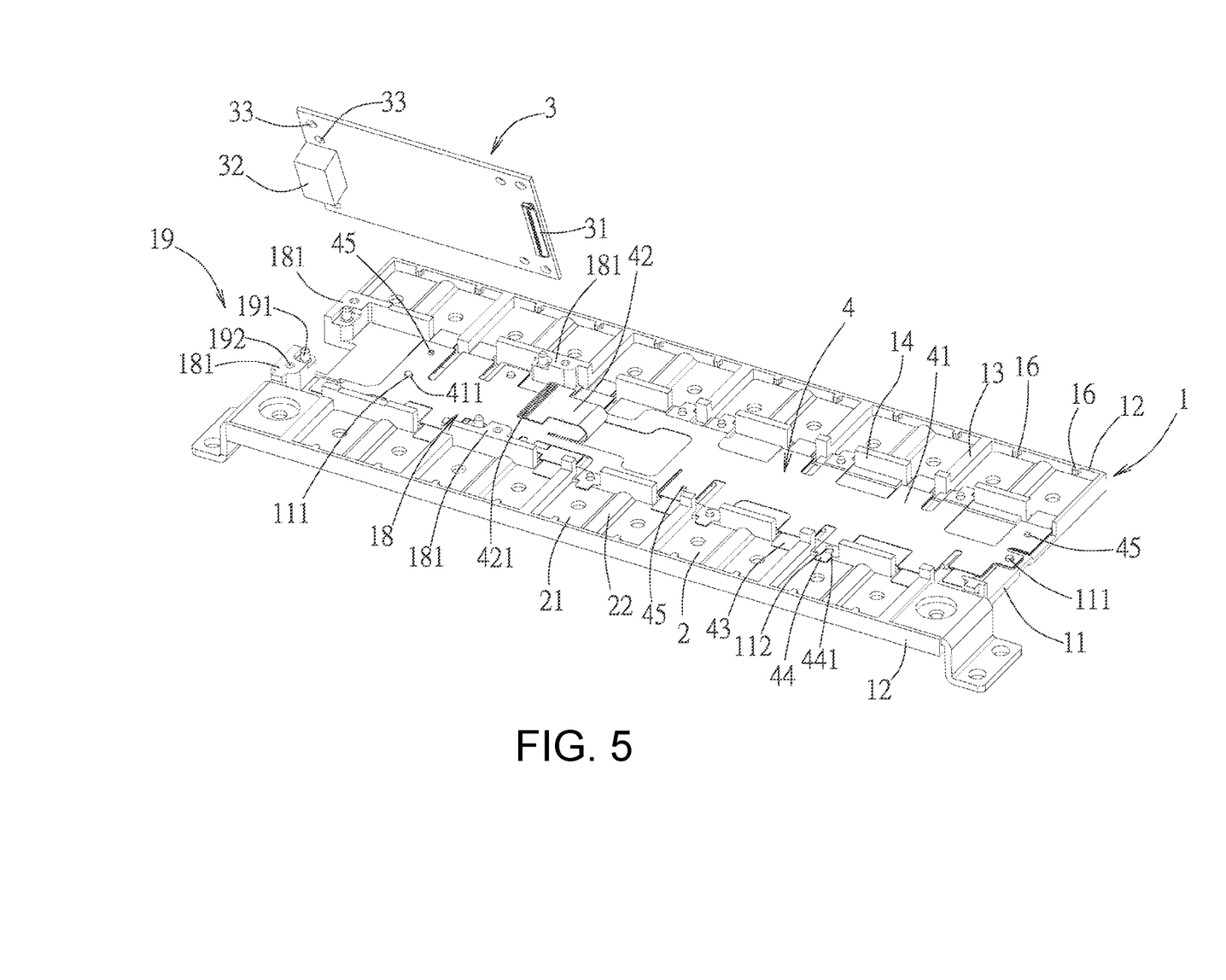
FIG. 5 is an exploded perspective view of the embodiment.
Figure 6:
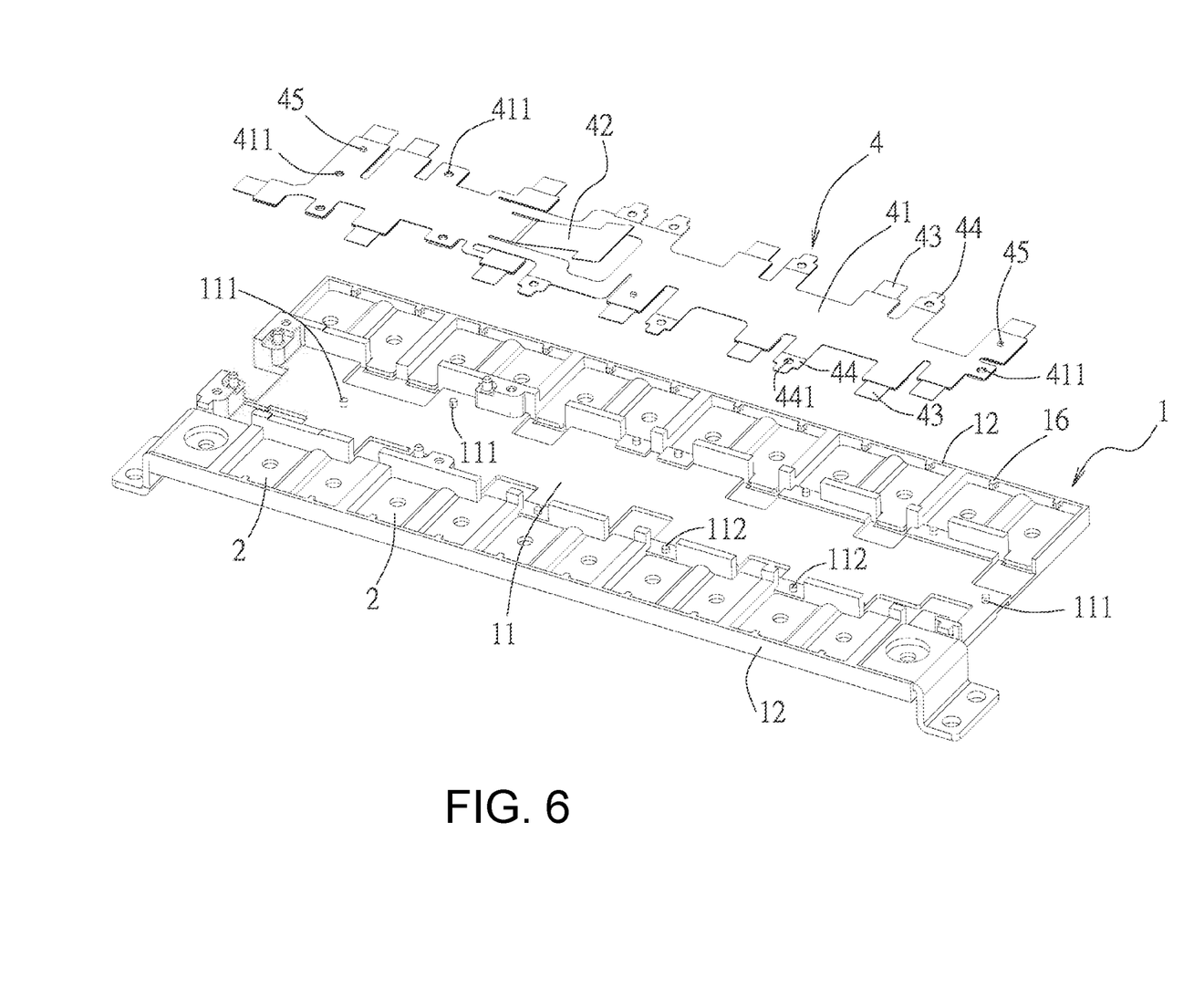
FIG. 6 is an exploded perspective view of the embodiment, in which a battery management system is omitted.
Figure 7:
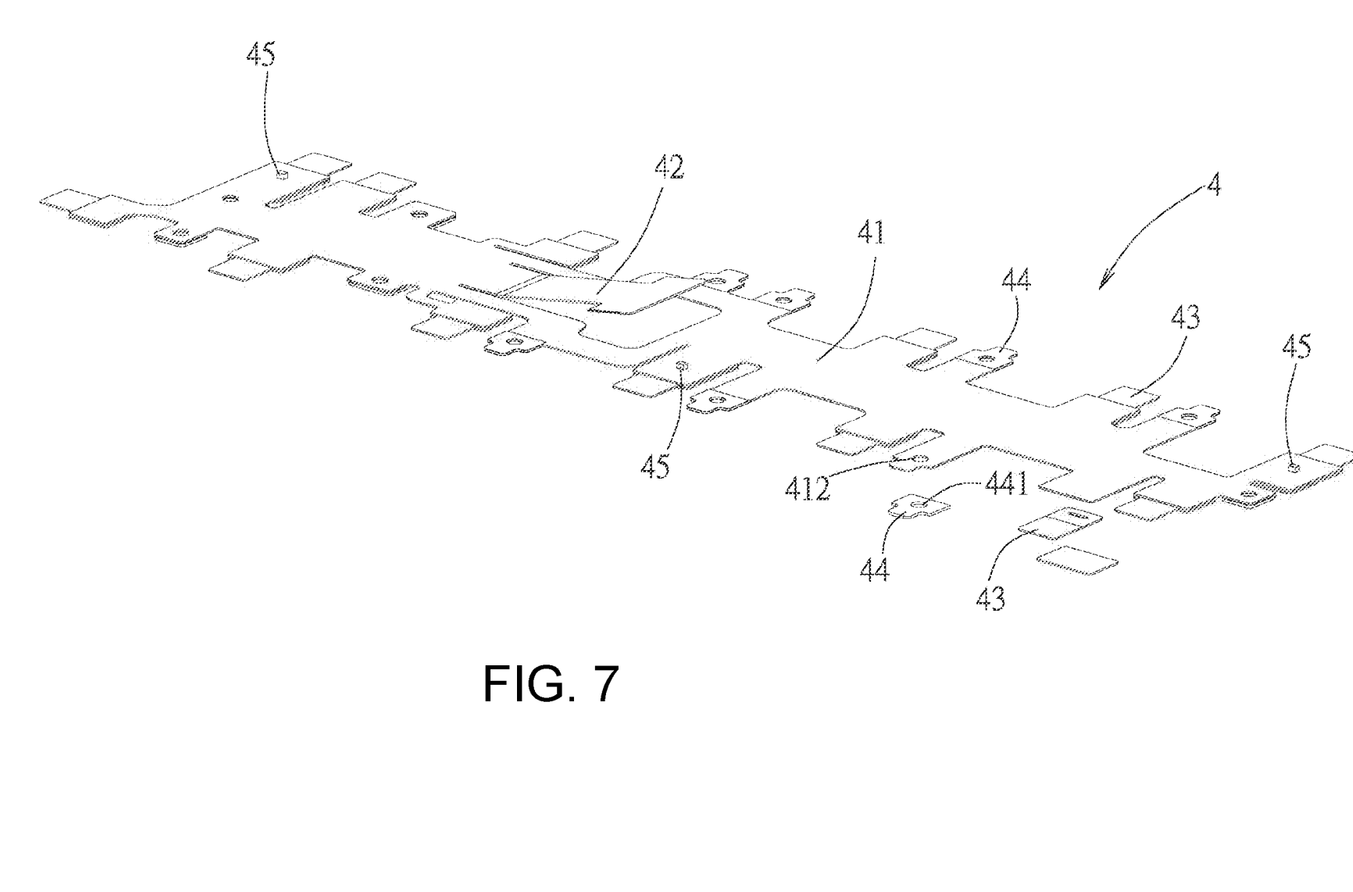
FIG. 7 is an exploded perspective view of a flexible circuit board of the embodiment.

Referring to FIG. 1 to FIG. 3, an embodiment of a battery connection module of the present disclosure is adapted to connect a battery pack 5, the battery connection module includes a carrying tray 1, a plurality of busbars 2, a battery management system 3 (abbreviated BMS) and a flexible circuit board 4.

The plurality of busbars 2 are mounted on the carrying tray 1, and are adapted to electrically connect a plurality of batteries 51 of the battery pack 5. Specifically, the carrying tray 1 is made of an insulating material, and has a base wall 11, two frame walls 12 facing each other and connected to both sides of the base wall 11, a plurality of spacing walls 13 and a plurality of position-limiting walls 14, the frame walls 12, the spacing walls 13 and the position-limiting walls 14 cooperatively define a plurality of mounting grooves 15 to respectively accommodate the plurality of busbars 2. The carrying tray 1 further has a plurality of upper position-limiting blocks 16 protruding from the plurality of frame walls 12, the plurality of upper position-limiting blocks 16 are respectively correspondingly positioned above the plurality of busbars 2 to limit the plurality of busbars 2. Two of the plurality of busbars 2 are electrode output pieces 2', each of the other busbars 2 has two electrode connecting portions 21 respectively connecting electrodes 52 of the adjacent two batteries 51 and a buffer bulging portion 22 connected between the two electrode connecting portions 21, the plurality of batteries 51 are connected in series via the plurality of busbars 2 and the two electrode output pieces 2' are respectively connected to the electrodes 52 at both ends of the series-connection. The carrying tray 1 further has a plurality of supporting ribs 17 respectively correspondingly supporting the plurality of buffer bulging portions 22.

Referring to FIG. 4 to FIG. 7, the battery management system 3 is mounted on the carrying tray 1, and comprises a flexible circuit board connector 31 and a main circuit connector 32. The main circuit connector 32 is adapted to connect a main circuit system of a device (not shown) on which the battery pack 5 is mounted. The carrying tray 1 has a mounting position 18 where the battery management system 3 is provided so as to allow the battery management system 3 is positioned above the flexible circuit board 4. The carrying tray 1 further has a plurality of first mounting structures 19 provided on a circumferential side of the mounting position 18a, and the battery management system 3 has a plurality of second mounting structures 33 respectively corresponding to the plurality of first mounting structures 19 to fix the battery management system 3 to the mounting position 18. In the embodiment, the mounting position 18 is defined by four protruding blocks 181 protruding the base wall 11, positions of the plurality of protruding blocks 181 respectively correspond to four corners of the battery management system 3. The plurality of first mounting structures 19 are respectively provided on the plurality of protruding blocks 181. The plurality of first mounting structures 19 are positioning posts 191 and locking holes 192, each protruding block 181 is provided with a positioning post 191 and a locking hole 192. The plurality of second mounting structures 33 are through holes, the through holes 33 corresponding to the positioning post 191 in position is used to allow the positioning post 191 to b pass through, and after the positioning post 191 passes through the through hole 33, the positioning post 191 can be hot melted a to fix the battery management system 3, and the through holes 33 corresponding to the locking hole 192 in position may allow a fastener, such as a screw (not shown), to pass through to be screwed to the locking hole 192 and fix the battery management system 3. In the embodiment, the plurality of first mounting structures 19 are the positioning posts 191 and the locking holes 192 to strengthen fixation of the battery management system 3, but in a variant embodiment, the plurality of first mounting structures 19 can be either positioning posts 191 alone or locking holes 192 alone, which can also have the fixation effect.

The flexible circuit board 4 is mounted on the carrying tray 1 and mechanically and electrically connected to the plurality of busbars 2, and comprises a flexible mating portion 42, and a distal end of the flexible mating portion 42 is mated to the flexible circuit board connector 31 to electrically connect with the flexible circuit board connector 31. In the embodiment, the flexible circuit board 4 further comprises a body portion 41, the flexible mating portion 42 is formed by cutting the body portion 41, three sides of the flexible mating portion 42 are disconnected with the body portion 41 shaped so that the flexible mating portion 42 is formed as an elongated shape and makes one end of the flexible mating portion 42 connected with the body portion 41, and other end of the flexible mating portion 42 has a plurality of exposed conductive wires 421 to mate with the flexible circuit board connector 31. And, the flexible mating portion 42 is bent reversely and then mated with the flexible circuit board connector 31.

In the embodiment, the body portion 41 has a plurality of mounting holes 411, the carrying tray 1 has a plurality of mounting posts 111 respectively passing through the plurality of mounting holes 411, the plurality of mounting posts 111 protrude from the base wall 11 to position the body portion 41 and the carrying tray 1 relative to each other. And the plurality of mounting posts 111 can be further hot melted to fix the body portion 41. The flexible circuit board 4 further comprises a plurality of conductive plates 43 which are connected to the body portion 41 and respectively mechanically and electrically connected to the plurality of busbars 2, and a plurality of upper position-limiting plates 44 which are connected to the body portion 41 and respectively protrude above the plurality of busbars 2. The plurality of busbars 2 electrically connect with the body portion 41 via the plurality of conductive plates 43, and then circuit traces (not shown) of the body portion 41 are connected to the conductive wires 421 of the flexible mating portion 42, and the plurality of conductive wires 421 are electrically connected with the flexible circuit board connector 31, so that the plurality of busbars 2 are electrically connected with the battery management system 3. In addition, in the embodiment, the flexible circuit board 4 further comprises a plurality of temperature sensors 45 provided on the body portion 41, the plurality of temperature sensors 45 are also electrically connected with the battery management system 3 via circuit traces of the body portion 41 and the flexible mating portion 42. Each upper position-limiting plate 44 has a fixing hole 441, the carrying tray 1 has a plurality of fixing posts 112 respectively passing through the plurality of fixing holes 441, and the body portion 41 further has a plurality of through holes 412 which respectively correspond to the plurality of fixing holes 441 in position to respectively allow the plurality of fixing posts 112 to pass through. The plurality of fixing posts 112 may be further hot melted to fix the plurality of upper position-limiting plates 44. The plurality of upper position-limiting plates 44 and the plurality of upper position-limiting blocks 16 cooperatively correspondingly limit the positions of the plurality of busbars 2.

In conclusion, the battery management system 3 is directly mounted on and coupled to the carrying tray 1 and is electrically connected with the busbars 2 via the flexible circuit board 4, so that they are integrated to an integrated module that facilitates subsequent assembling and use. And the battery management system 3 only needs to be provided with one flexible circuit board connector 31 to directly connect with the flexible circuit board 4, which can reduce the number of components and save cost. Further, the flexible mating portion 42 connected to the battery management system 3 is formed by cutting the body portion 41 constituting the flexible circuit board 4, which can effectively utilize the space, and is easy to cooperate to the position where the battery management system 3 is coupled to the carrying tray 1, so that the position where the battery management system 3 is provided has flexibility of change.

Figure 8:
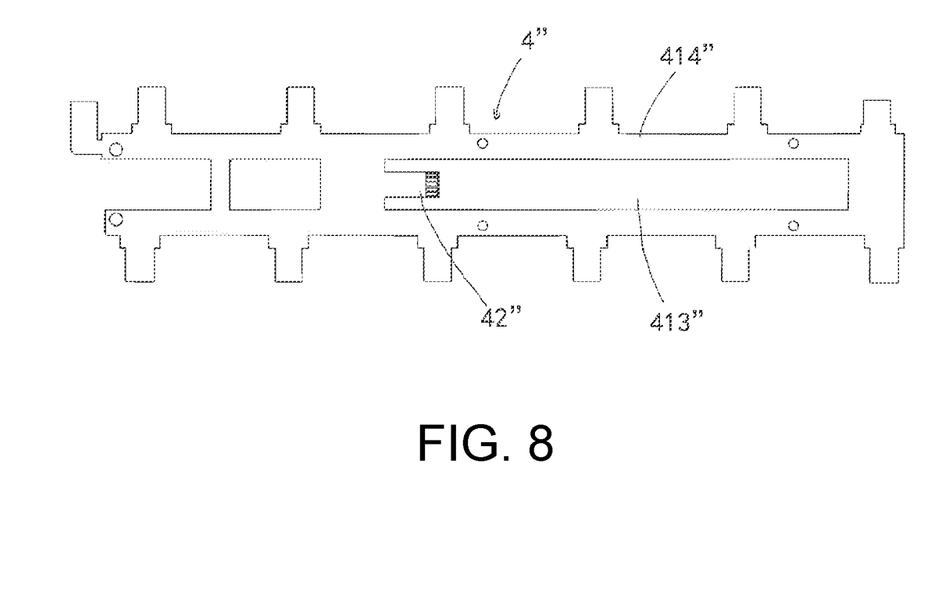
FIG. 8 is a diagram of another embodiment of the battery connection module of the present disclosure.

A second embodiment of the present disclosure will now be described with reference to FIG. 8, FIG. 8 is a perspective view of a second embodiment of the battery connection module of the present disclosure. For the sake of brevity, only parts different from the above-described embodiment will be described herein, and description of the remaining identical parts can be referred to the above.

As shown in FIG. 8, in the embodiment, the flexible circuit board 4" has a frame-shaped portion 414" formed by providing an opening 413", the flexible mating portion 42" extends into the opening 413" of the frame-shaped portion 414". The flexible mating portion 42" has the exposed conductive wires, bends 180 degrees reversely to correspondingly mate with the flexible circuit board connector 31 on the battery management system 3. Thus, the battery management system 3 is electrically connected with the busbars 2 via the flexible circuit board 4". Thus, they are integrated to an integrated module that facilitates subsequent assembling and use. And the battery management system 3 only needs to be provided with one flexible circuit board connector 31 to directly connect with the flexible circuit board 4", which can reduce the number of components and save cost.

However, the above description is only for the embodiments of the present disclosure, the implementation scope of the present disclosure is not limited thereto, simple equivalent changes and modifications made according to the scope of the Claims and the specification of the present disclosure are still included in the scope of the present disclosure.

What is claimed is:

1. A battery connection module which is configured to connect to a battery pack, the battery pack comprising a plurality of batteries arranged side-by-side, each battery configured to have a pair of electrodes extending upwardly from an upper surface thereof, the battery connection module comprising:
a carrying tray having a base wall, the base wall having all upper surface and a lower surface, the lower surface of the carrying tray being configured to face the upper surface of the plurality of batteries;
a plurality of busbars mounted on the upper surface of the base wall of the carrying tray, each busbar having a lower surface which is configured to directly electrically connect to at least one of the electrodes of the battery pack;
a flexible circuit board mounted on the upper surface of the base wall of the carrying tray, the flexible circuit board being mechanically and electrically connected to an upper surface of each busbar, the flexible circuit board having a frame-shaped portion with an opening extending therethrough, the flexible circuit board defining, a flexible mating portion which extends into the opening of the frame-shaped portion; and
a battery management system mounted on the carrying tray, the batter management system being positioned above the flexible circuit board, the battery management system having a flexible circuit board connector, wherein the flexible mating portion is reversely bent and mated with the flexible circuit board connector on the battery management system.

2. The battery connection module of claim 1, wherein the flexible mating portion has exposed conductive wires to be mated with the flexible circuit board connector.

3. The battery connection module of claim 1, wherein the flexible circuit board has a plurality of conductive plates which are connected to the frame-shaped portion, the plurality of conductive plates being mechanically and electrically connected to the upper surface of the plurality of busbars.

4. A battery connection module which is configured to connect to a battery pack, the battery pack comprising a plurality of batteries arranged side-by-side, each battery configured to have a pair of electrodes extending upwardly from an upper surface thereof, the battery connection module comprising:
a carrying tray having a base wall and first and second frame walls, the base wall having an upper surface and a lower surface, the lower surface of the carrying tray being configured to face the upper surface of the plurality of batteries, the first frame wall extending upwardly from the upper surface of the base wall along a first side of the base wall, the second frame wall extending upwardly from the upper surface of the base wall along a second side of the base wall, the first side of the base wall being opposite the second side of the base wall;
a plurality of first bus bars provided in a first row and mounted on the upper surface of the base wall of the carrying tray and along the first frame wall, each first busbar having a lower surface which is configured to directly electrically connect to at least one of the electrodes of the battery pack;
a plurality of second busbars provided in a second row and mounted on the upper surface of the base wall of the carrying tray and along the second frame wall, each second busbar having a lower surface which is configured to directly electrically connect to at least one of the electrodes of the battery pack;
a flexible circuit board mounted on the upper surface of the base wall of the carrying tray and positioned between the first and second rows of the plurality of first and second busbars, respectively, the flexible circuit board being mechanically and electrically connected to an upper surface of each first busbar and each second busbar, the flexible circuit board having a frame-shaped portion with an opening extending therethrough, the flexible circuit board defining a flexible mating portion which extends into the opening of the frame-shaped portion; and
a battery management system mounted on the carrying tray, the battery management system being positioned above the flexible circuit board, the battery management system having a flexible circuit board connector, wherein the flexible mating portion is reversely bent and mated with the flexible circuit board connector on the battery management system.

5. The battery connection module of claim 4, wherein the flexible mating portion has exposed conductive wires to be mated with the flexible circuit board connector.

6. The battery connection module of claim 4, wherein the flexible circuit board has a plurality of conductive plates which are connected to the frame-shaped portion, the plurality of conductive plates being mechanically and electrically connected to the upper surface of the plurality of first and second busbars.

\* \* \* \* \*